(12) United States Patent
Wang et al.

(10) Patent No.: US 7,381,619 B2
(45) Date of Patent: Jun. 3, 2008

(54) DUAL WORK-FUNCTION METAL GATES

(75) Inventors: Chih-Hao Wang, Hsin-chu (TW); Yu-Shen Lai, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 95 days.

(21) Appl. No.: 10/832,679

(22) Filed: Apr. 27, 2004

(65) Prior Publication Data

US 2005/0253173 A1 Nov. 17, 2005

(51) Int. Cl.
*H01L 21/8238* (2006.01)

(52) U.S. Cl. .................. 438/275; 438/216; 438/287; 257/E21.637

(58) Field of Classification Search ........ 438/591–592, 438/199, 585, 587–588, 227–228, 152–154, 438/775, 216, 275, 287; 257/407, 388
See application file for complete search history.

(56) References Cited

U.S. PATENT DOCUMENTS

| | | | |
|---|---|---|---|
| 5,854,115 A * | 12/1998 | Gardner et al. | 438/305 |
| 6,136,654 A * | 10/2000 | Kraft et al. | 438/287 |
| 6,410,376 B1 * | 6/2002 | Ng et al. | 438/199 |
| 6,541,395 B1 * | 4/2003 | Trivedi et al. | 438/775 |
| 6,645,798 B2 * | 11/2003 | Hu | 438/197 |
| 6,709,911 B1 * | 3/2004 | Doczy et al. | 438/197 |
| 6,821,833 B1 * | 11/2004 | Chou et al. | 438/775 |
| 6,828,185 B2 * | 12/2004 | Lim et al. | 438/216 |
| 6,835,639 B2 * | 12/2004 | Rotondaro et al. | 438/592 |
| 6,919,251 B2 * | 7/2005 | Rotondaro et al. | 438/287 |
| 6,936,508 B2 * | 8/2005 | Visokay et al. | 438/199 |
| 6,949,479 B2 * | 9/2005 | Wang | 438/775 |
| 7,101,747 B2 * | 9/2006 | Hu | 438/199 |
| 2003/0164525 A1 * | 9/2003 | Rotondaro et al. | 257/390 |
| 2004/0018681 A1 * | 1/2004 | Pham et al. | 438/257 |
| 2004/0023478 A1 * | 2/2004 | Samavedam et al. | 438/592 |
| 2005/0130442 A1 * | 6/2005 | Visokay et al. | 438/775 |

OTHER PUBLICATIONS

Suh, Y-S., et al., "Effect of the Composition on the Electrical Properties of $TaSi_xN_y$ Metal Gate Electrodes," IEEE Electron Device Letters, vol. 24, No. 7 (Jul. 2003) pp. 439-441.

* cited by examiner

Primary Examiner—Wai-Sing Louie
(74) Attorney, Agent, or Firm—Slater & Matsil, L.L.P.

(57) ABSTRACT

A semiconductor device having dual work-function structures, such as dual work-function gate electrodes of transistors. In the preferred embodiment in which NMOS and PMOS transistors are formed on a semiconductor device, the transistors are initially formed with a dummy gate electrode and a dummy dielectric layer. The dummy gate electrode and dummy dielectric layers are removed. A gate dielectric layer and a first electrode layer are formed. A nitridation process is performed on the NMOS transistor to reduce the work function of the gate electrode. A second electrode layer is then formed on the first electrode layer.

11 Claims, 4 Drawing Sheets

DUAL WORK-FUNCTION METAL GATES

TECHNICAL FIELD

The present invention relates generally to semiconductor devices, and more particularly to dual work-function metal electrode gates for metal oxide semiconductor field-effect transistors (MOSFETs).

BACKGROUND

Complementary metal-oxide-semiconductor (CMOS) technology is the dominant semiconductor technology used for the manufacture of ultra-large scale integrated (ULSI) circuits today. Current CMOS transistors typically utilize polysilicon as the gate electrode for both NMOS and PMOS transistors, wherein the polysilicon is doped with an N-type dopant to form NMOS transistors and is doped with a P-type dopant to form PMOS transistors. Polysilicon gates, however, often exhibit gate depletion problems.

As a result, CMOS transistors with metal gates have been attempted. Furthermore, because PMOS and NMOS function differently, it is desirable to fabricate PMOS and NMOS transistors having gates of different work functions. Generally, this is obtained by using different metal gates on the PMOS and NMOS transistors. One method of fabricating PMOS and NMOS transistors is by depositing a first metal layer on both the NMOS and PMOS gates and etching the metal layer from one of them. The etching process, however, frequently damages the gate dielectric layer, thereby affecting the performance of the transistor.

Another method that has been attempted is to deposit a metal layer for both the NMOS and PMOS transistors, but then performing an ion implant to alter the work function of either the NMOS or PMOS transistor. This method, however, is difficult to optimize the work function of both the NMOS and PMOS transistors.

Therefore, there is a need for an apparatus, and a method of manufacture, with metal gates having a first work function for a PMOS device and a second work function for an NMOS device that may be fabricated in a cost-effective manner.

SUMMARY OF THE INVENTION

These and other problems are generally reduced, solved or circumvented, and technical advantages are generally achieved, by embodiments of the present invention, which provides dual work function gate electrodes.

In one embodiment of the present invention, a semiconductor device having a PMOS transistor and an NMOS transistor with different work functions is provided. The gate electrode of the PMOS transistor may be formed by depositing a metal, a metal silicon nitride, a metal compound, a transistion metal, a silicide of a metal or a transition metal, or a combination thereof over a gate dielectric. In the preferred embodiment, tantalum silicon nitride is used. A process, such as annealing, a rapid thermal anneal, a laser treatment, or the like, is performed to form a silicide layer between the gate electrode and the gate dielectric. The NMOS transistor may be formed by performing a nitridation process on the gate dielectric prior to forming the gate electrode. The gate electrode may be one or more layers of a conductive material.

In another embodiment of the present invention, a first metal layer is formed over the gate dielectric of a PMOS transistor and an NMOS transistor. A nitridation process is performed on the NMOS transistor and a process, such as annealing, a rapid thermal anneal, a laser treatment, or the like, is performed to form a silicide layer between the first metal layer and the gate dielectric of the PMOS transistor. The gate electrode is formed over the first metal layer and may be one or more layers of a conductive material.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
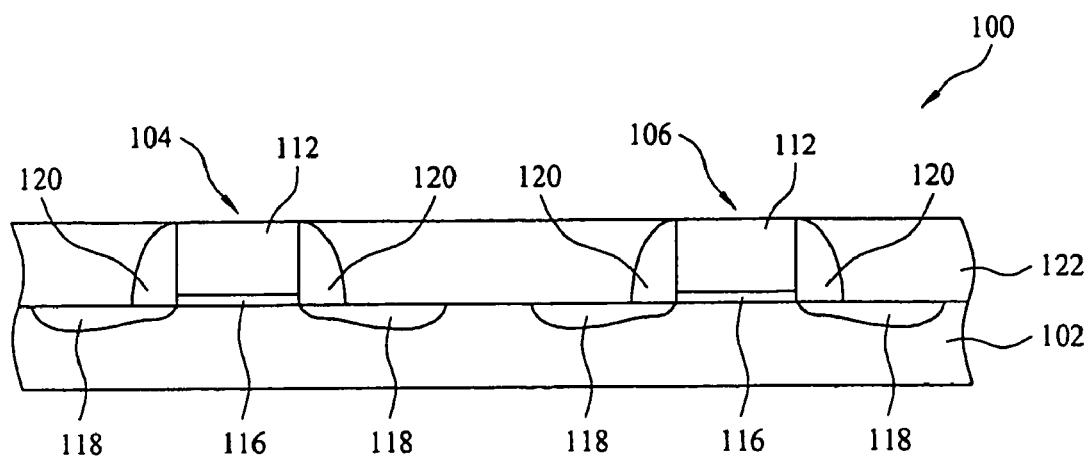
FIGS. 1a-1f are cross-section views of a wafer illustrating a process of forming dual work function gate electrodes in accordance with a first embodiment of the present invention.

The making and using of the presently preferred embodiments are discussed in detail below. It should be appreciated, however, that the present invention provides many applicable inventive concepts that can be embodied in a wide variety of specific contexts. In particular, the method of the present invention is described in the context of forming dual work function gate electrodes of a transistor. One of ordinary skill in the art, however, will appreciate that the process described herein may be used for forming any type of device or structure that may use dual work function structures. Accordingly, the specific embodiments discussed herein are merely illustrative of specific ways to make and use the invention, and do not limit the scope of the invention.

Furthermore, the embodiments of the present invention are illustrated as fabricating a PMOS and an NMOS transistor adjacent to each other for illustrative purposes only. The PMOS and NMOS transistors may be spaced apart or fabricated separately. Additionally, other structures, such as isolation trenches may be present.

FIGS. 1a-1f illustrate cross-section views of a portion of a semiconductor wafer 100 during various steps of a first method embodiment of the present invention. The process begins in FIG. 1a, wherein a semiconductor wafer 100 having a substrate 102 with a first transistor 104 and a second transistor 106 formed thereon. Each of the first transistor 104 and the second transistor 106 includes a dummy gate electrode 112, source/drain regions 118, and a dummy gate dielectric layer 116 formed between the dummy gate electrode 112 and the substrate 102. Spacers 120 are formed alongside the dummy gate electrodes 112. An interlayer dielectric (ILD) layer 122 may be added to fill the gaps between devices, e.g., the first transistor 104 and the second transistor 106, and to allow a substantially planar surface. The planar surface is frequently formed by a chemical mechanical polishing (CMP). The structure shown in FIG. 1a may be formed by standard processes known in the art and may comprise either NMOS structures, PMOS structures, or a combination thereof. The embodiment illustrated in FIGS. 1a-1f, however, assume that the first transistor 104 is fabricated as a PMOS transistor and the second transistor 106 is fabricated as an NMOS transistor.

In the preferred embodiment, the spacers 120 are less than about 500 Å in width, the source/drain regions 118 are silicided to a depth of less than about 200 Å, and the junction extension depth is less than about 200 Å.

Figure 1B:
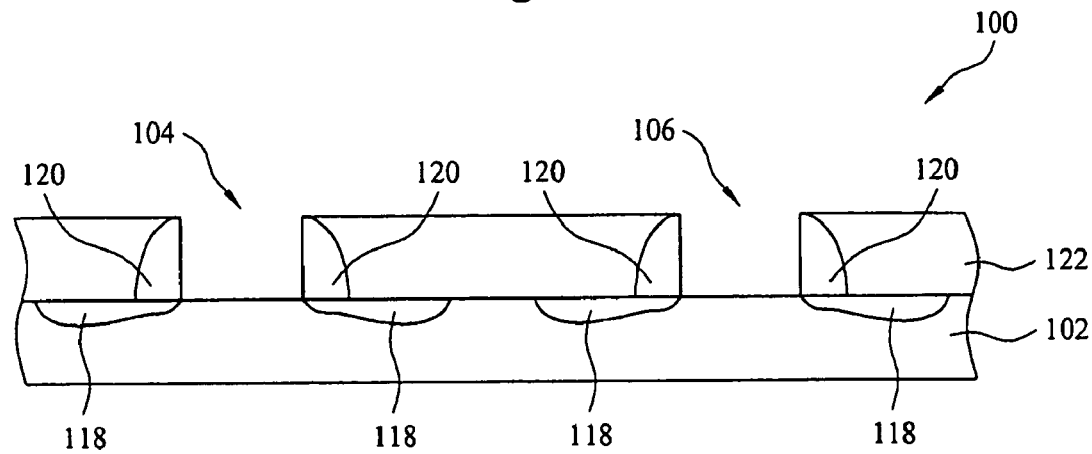

In FIG. 1b, the dummy gate electrode 112 and the dummy gate dielectric layer 116 are removed. The dummy gate electrode 112 and the dummy gate dielectric layer 116 may be removed, for example, by one or more etching steps. In one embodiment of the present invention in which the dummy gate electrode 112 comprises polysilicon and the dummy gate dielectric 116 comprises silicon dioxide, the dummy gate electrode 112 and dummy gate dielectric layer 116 may be removed by for example, a wet or dry, anisotropic or isotropic, etch process, but preferably an anisotropic dry etch process.

It should be noted that in the preferred embodiment a mask (not shown), such as $Si_3N_4$, a photoresist material, or the like, is applied and patterned prior to removing the dummy gate electrode 112 and the dummy gate dielectric layer 116. The mask protects areas other than the dummy gate electrode 112 and the dummy gate dielectric layer 116, such as the ILD 122 and spacers 120 during the etching process described above. After removing the dummy gate electrode 112 and the dummy gate dielectric layer 116, the mask may be removed, for example, by using an etch in hot phosphoric acid.

Figure 1C:
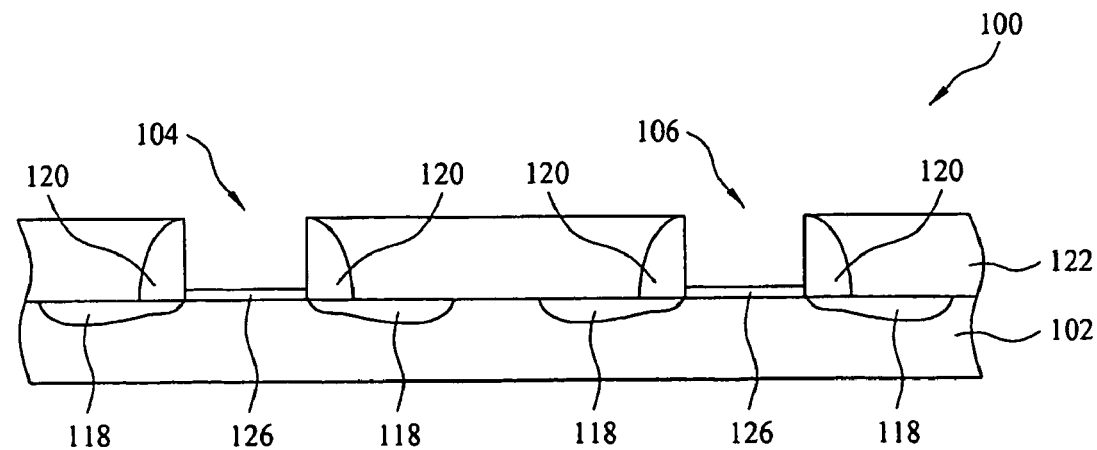

FIG. 1c illustrates the wafer 100 after a gate dielectric layer 126 is formed. It should be noted that the gate dielectric layer 126 may be formed of the same material as the dummy gate dielectric layer 116 that was removed in a previous step. However, the gate dielectric material may become damaged during the etching process to remove the dummy gate electrode. For this reason, it is desirable to remove the dummy gate dielectric layer 116 and reform it as the gate dielectric 126.

In the preferred embodiment, the gate dielectric layer 126 is an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-orthosilicate (TEOS) and oxygen as a precursor. Alternatively, the gate dielectric layer 126 may be, for example, silicon nitride ($Si_3N_4$), a material with a dielectric constant greater than about 3.9 eV, or the like. In the preferred embodiment, the gate dielectric layer 126 is about 5 Å to about 100 Å in thickness, but more preferably about 13 Å in thickness. The thickness of the gate dielectric layer 126 may be thinner or thicker to fulfill specific size requirements and electrical characteristics for a particular application.

Figure 1D:
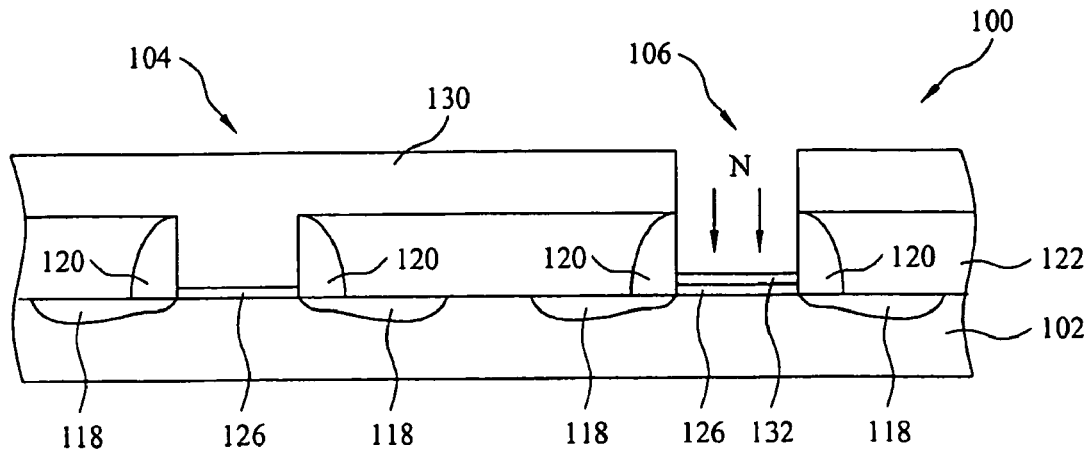

FIG. 1d illustrates wafer 100 of FIG. 1c after a mask 130 has been applied and patterned, and a portion of the gate dielectric layer 126 has become nitrogenated to form a nitride layer 132. Generally, the nitrogenation process comprises introducing nitrogen atoms by exposing a surface to a nitrogen-containing ambient, such as a nitrogen-containing plasma. For gate dielectric layer 126 less than about 40 Å in thickness, it is preferred that the gate dielectric layer 126 is substantially nitrogenated.

The mask 130 is preferably a photo resist or other polymer that is commonly used in the art. It should be noted that the mask 130 protects the first transistor 104 during the nitridation process. As discussed above, the first transistor 104 is to be fabricated as a PMOS transistor and the second transistor 106 is to be fabricated as an NMOS transistor. Because it is desirable to only perform the nitridation process on the NMOS transistor, the PMOS transistor is covered with the mask 130.

Nitridation may be performed, for example, by an ion implant, a diffusion process, a laser process, a thermal anneal (e.g., thermal anneal or a rapid thermal anneal (RTA)) in a nitrogen ambient, or by a decoupled plasma nitridation (DPN) process. In this embodiment, the nitridation process forms a nitride layer about 3 Å to about 40 Å in thickness. Other processes and thicknesses may be used.

Figure 1E:
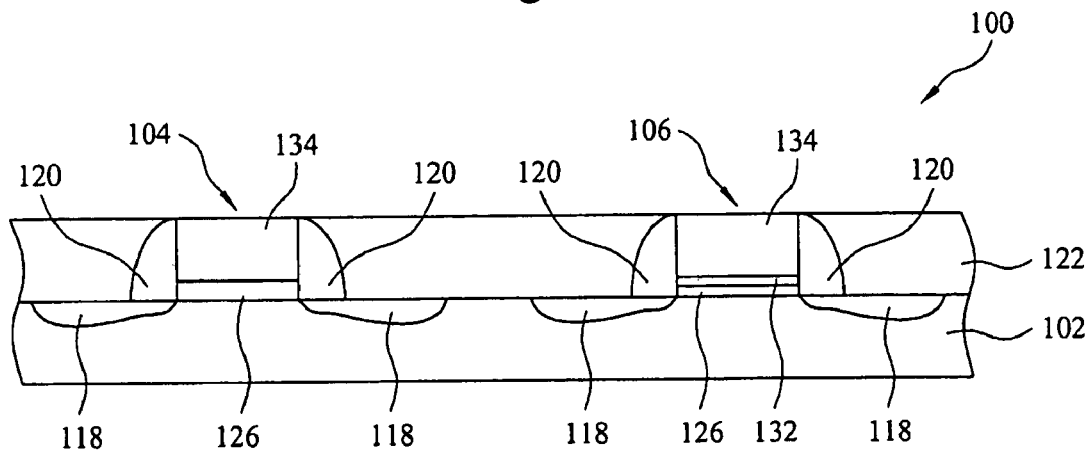

In FIG. 1e, the wafer 100 is shown after the mask 130 (FIG. 1d) has been removed, an electrode layer 134 has been deposited, and the wafer 100 has been planarized. The electrode layer 134 may be one or more layers of any conductive material suitable for the semiconductor device being formed, such as, for example, a metal, a metal compound, a transition metal, metal silicon nitride, a silicide of a transition metal or a metal, a combination thereof, or the like. In the preferred embodiment, the electrode layer 134 comprises Si-rich TaSiN and may be deposited, for example, by sputtering, CVD, atomic layer CVD (ALCVD), or the like. In another embodiment, a first layer, preferably Si-rich TaSiN or the like, is deposited and a second layer is deposited on the first layer. The second layer may be, for example, tantalum, tungsten, aluminum, or the like. The gate electrode is preferably less than about 1000 Å.

Preferably, a CMP process is performed after the electrode layer 134 is formed to planarize the surface of the wafer 100. The CMP process may be performed, for example, utilizing an oxide slurry.

Figure 1F:
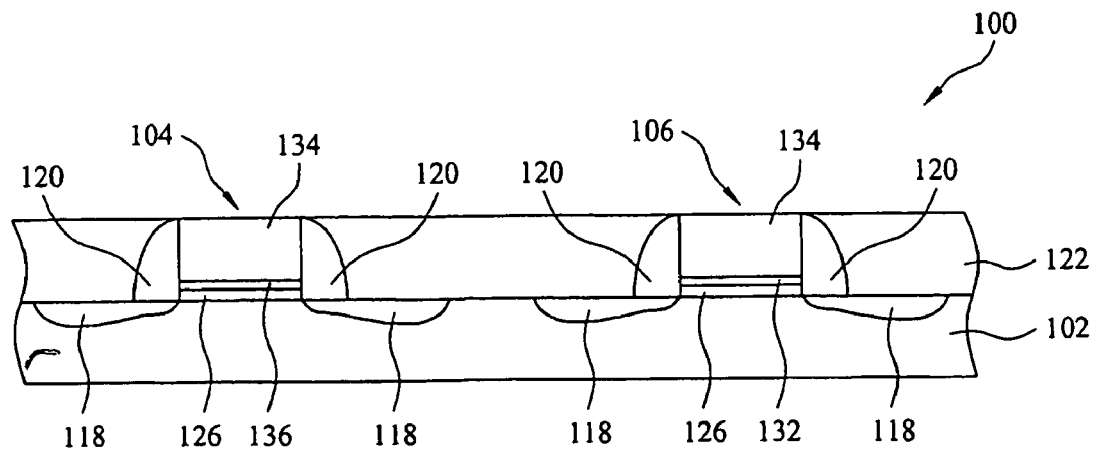

FIG. 1f illustrates the wafer 100 of FIG. 1e after an anneal has been performed to form a silicide layer 136 between the gate dielectric 126 and the gate electrode 134 of the first transistor 104. Annealing causes the TaSiN to react with the gate dielectric layer 126. In the preferred embodiment in which the gate dielectric layer 126 is formed of silicon dioxide, a layer of tantalum silicide ($TaSi_2$) will be formed between the TaSiN of the gate electrode 134 and the gate dielectric layer 126 of the first transistor 104. The $TaSi_2$ layer generally has a work function $\phi_m$ greater than about 4.5 eV, but preferably about 4.8 eV, and are suitable for use as PMOS devices.

The nitridation performed on the gate dielectric layer 126 of the second transistor 106 suppresses the formation of $TaSi_2$ during the annealing process. The TaSiN of the second transistor preferably exhibits a work function $\phi_m$ less than about 4.5 eV, but more preferably about 4.33 eV to about 4.36 eV. It has been found that transistors such as transistor 106 are suitable for use as NMOS devices.

FIGS. 2a-2d are cross-section views of a portion of a semiconductor wafer 200 during various steps of a second method embodiment of the present invention. The second method embodiment illustrated in FIGS. 2a-2d assumes a wafer similar to the wafer described above with reference to FIGS. 1a-1c is provided. Accordingly, the second method embodiment begins in FIG. 2a wherein a first electrode layer 210 is formed on a wafer prepared in accordance with wafer 100 of FIGS. 1a-1c.

The first electrode layer 210 may be any conductive material suitable for the structure being formed, such as, for example, TaSiN, titanium, nitrides, silicides, metals, transition metals, and the like. In the preferred embodiment, the first electrode layer 210 comprises Si-rich TaSiN and may be deposited, for example, by sputtering.

Figure 2A:
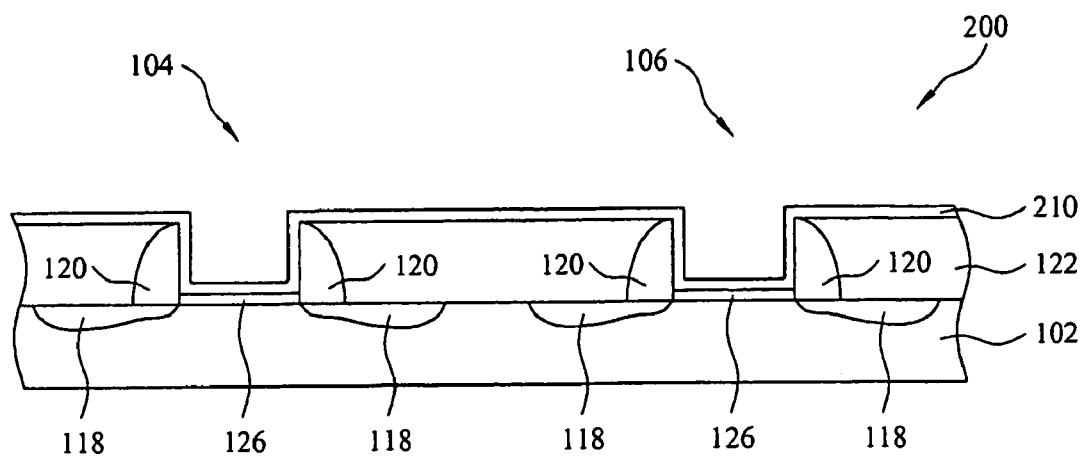
FIGS. 2a-2d are cross-section views of a wafer illustrating a process of forming dual work function gate electrodes in accordance with a second embodiment of the present invention.
Figure 2B:
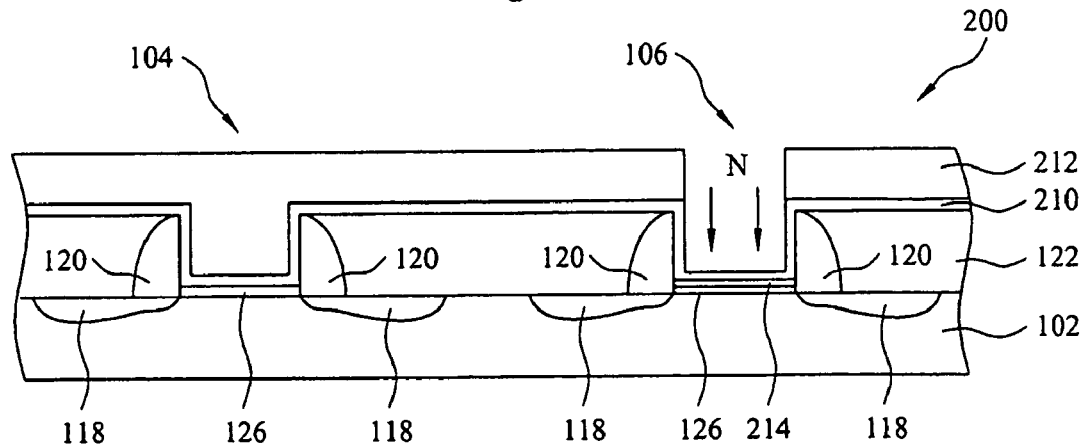

FIG. 2b illustrates the wafer of FIG. 2a after a mask 212 has been applied and patterned, and a nitrogenation process has been performed. It should be noted that the mask 212 protects the first transistor 104 during the nitrogenation process, which may be performed by a diffusion process, an ion implantation process, a laser process, a DPN process, or the like. A nitride layer 214 is thus formed by the nitrogenation process. As discussed above, the first transistor 104 is to be fabricated as a PMOS transistor and the second transistor 106 is to be fabricated as an NMOS transistor. Because it is desirable to only perform the nitrogen implant on the NMOS transistor, the PMOS transistor is protected by the mask 212. The mask 212 is preferably a photo resist or polymer material commonly used in the industry.

Figure 2C:
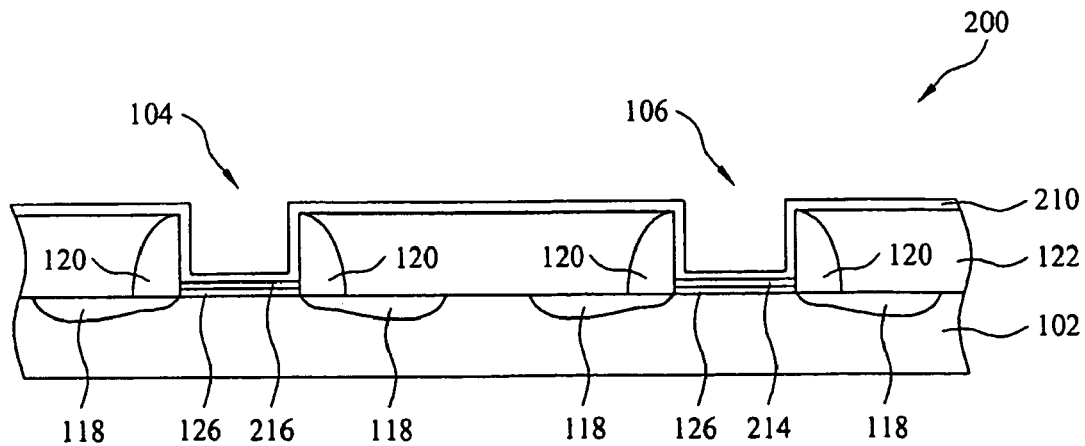

In FIG. 2c, the wafer 200 is shown after the mask 212 has been removed and a silicide layer 216 has been formed. Annealing causes the first electrode layer 210 to react with the gate dielectric layer 126, which is preferably formed of silicon dioxide. In the preferred embodiment in which the first electrode layer 210 is TaSiN, a layer of tantalum silicide (TaSi$_2$) is formed between the first electrode layer 210 and the gate dielectric layer 126 of the first transistor 104. As discussed above with reference to FIG. 1f, the TaSi$_2$ has a work function of greater than about 4.5 eV, which is suitable for PMOS devices.

As a result of the nitrogenation process the gate dielectric layer 126 and the first electrode layer 210 may be completely or partially nitrogenated. The nitridation performed on the gate dielectric layer 126 and the first electrode layer 210 of the second transistor 106 suppresses the TaSi$_2$ formation during the annealing process. As discussed above with reference to FIG. 1f the TaSiN has a work function of less than about 4.5 eV, which is suitable for NMOS devices.

Figure 2D:
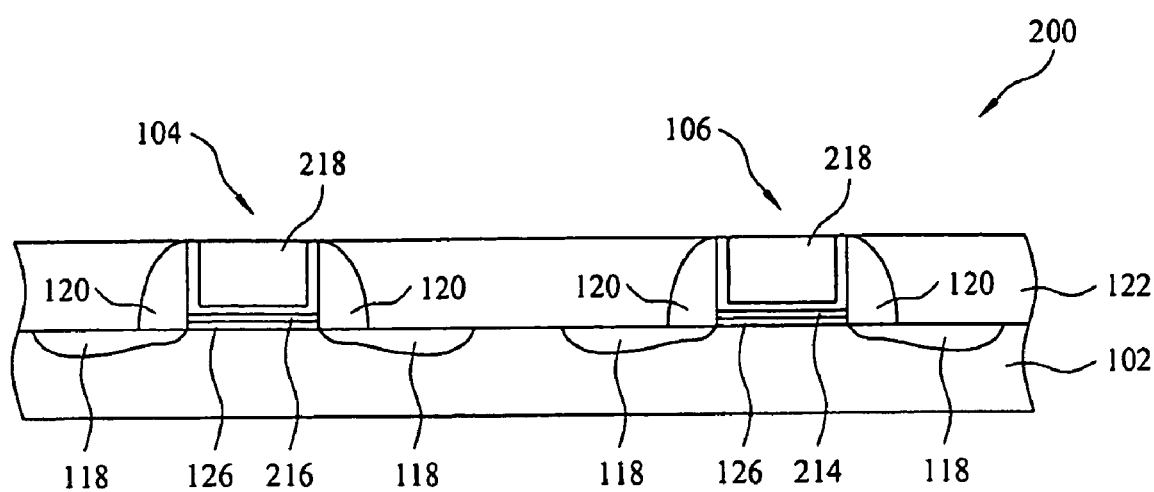

FIG. 2d illustrates the wafer 200 after a second electrode layer 218 has been formed. The second electrode layer 218 may be one or more layers of any conductive material suitable for the structure being formed, such as, for example, a metal, a metal compound, a transition metal, metal silicon nitride, a silicide of a transition metal or a metal, a combination thereof, or the like.

Preferably, a CMP process is performed after the second electrode layer 218 is formed to planarize the surface of the wafer 200. The CMP process may be performed, for example, utilizing an oxide slurry.

Thereafter, standard processing steps may be performed to complete fabrication of the semiconductor device. For example, an interlayer dielectric (ILD) layer and contacts therethrough may be formed.

In the foregoing specification, the invention has been described with reference to specific embodiments. However, various modifications and changes can be made by one skilled in the art without departing from the scope of the present invention. Accordingly, the specification and figures are to be regarded in an illustrative rather than a restrictive sense, and all such modifications are intended to be included within the scope of the present invention. For example, while the present invention has been illustrated with reference to fabricating two semiconductor devices, it is understood that the present invention may be extended to fabricate three or more semiconductor devices with structures having varying work functions.

Although particular embodiments of the invention have been described in detail, it is understood that the invention is not limited correspondingly in scope, but includes all changes, modifications, and equivalents coming within the spirit and terms of the claims appended hereto. For example, differing types of materials and differing thicknesses may be used, and the like. Accordingly, it is understood that this invention may be extended to other structures and materials, and thus, the specification and figures are to be regarded in an illustrative rather than a restrictive sense.

What is claimed is:

1. A method of forming a semiconductor device, the method comprising:
   forming respective gate dielectrics of the first transistor and the second transistor;
   forming a first layer on the gate dielectrics;
   nitridating the gate dielectric of the second transistor after the step of forming the first layer;
   forming respective gate electrodes for the first transistor and the second transistor; and
   after the step of nitridating, forming a suicide layer by annealing the semiconductor device, wherein the silicide layer is formed between the gate electrode of the first transistor and the gate dielectric of the first transistor.

2. The method of claim 1, wherein the first transistor is the PMOS transistor and the second transistor is the NMOS transistor.

3. The method of claim 1, wherein the gate dielectric comprises a material selected from the group consisting of SiO2, SiON, and a combination thereof.

4. The method of claim 1, wherein the gate dielectric comprise a material having a dielectric constant greater than about 3.9.

5. The method of claim 1, wherein the gate electrode is formed of a material selected from the group consisting of a metal, a metal compound, a transition metal, a metal silicon nitride, a silicide of a transition metal or a metal, and a combination thereof.

6. The method of claim 1, wherein the first transistor has a work function greater than or equal to about 4.5 eV.

7. The method of claim 1, wherein the second transistor has a work function less than or equal to about 4.5 eV.

8. The method of claim 1, further comprising the step of planarizing the surface of the semiconductor device.

9. The method of claim 1, wherein the first layer includes TaSiN.

10. The method of claim 1, wherein the step of performing the nitridation process is performed by an ion implant, a diffusion process, a laser process, an anneal, or a decoupled plasma nitridation process.

11. The method of claim 1, wherein the silicide layer is formed by a process selected from selected from annealing, rapid thermal anneal, and a laser treatment.

* * * * *

UNITED STATES PATENT AND TRADEMARK OFFICE
CERTIFICATE OF CORRECTION

PATENT NO. : 7,381,619 B2 Page 1 of 1
APPLICATION NO. : 10/832679
DATED : June 3, 2008
INVENTOR(S) : Wang et al.

It is certified that error appears in the above-identified patent and that said Letters Patent is hereby corrected as shown below:

In Col. 6, line 21, delete "suicide" and insert --silicide--.
In Col. 6, line 54, after process, delete "selected from".

Signed and Sealed this

Nineteenth Day of August, 2008

JON W. DUDAS
*Director of the United States Patent and Trademark Office*